United States Patent
Trotta et al.

(10) Patent No.: US 9,666,543 B2
(45) Date of Patent: May 30, 2017

(54) ELECTRONIC SYSTEM

(71) Applicant: Infineon Technologies AG, Neubiberg (DE)

(72) Inventors: Saverio Trotta, Munich (DE); Jagjit Singh Bal, Ottobrunn (DE); Ulrich Moeller, Holzkirchen (DE); Andrzej Samulak, Lindau (DE); Werner Simbuerger, Haar (DE)

(73) Assignee: Infineon Technologies AG, Neubiberg (DE)

( * ) Notice: Subject to any disclaimer, the term of this patent is extended or adjusted under 35 U.S.C. 154(b) by 39 days.

(21) Appl. No.: 14/690,025

(22) Filed: Apr. 17, 2015

(65) Prior Publication Data

US 2015/0305190 A1    Oct. 22, 2015

(30) Foreign Application Priority Data

Apr. 17, 2014   (DE) ........................ 10 2014 105 594

(51) Int. Cl.
*H01L 23/66* (2006.01)
*H01L 23/367* (2006.01)
*H01L 23/40* (2006.01)

(52) U.S. Cl.
CPC .......... *H01L 23/66* (2013.01); *H01L 23/3675* (2013.01); *H01L 23/40* (2013.01); *H01L 23/4006* (2013.01); *H01L 2023/4087* (2013.01); *H01L 2223/6627* (2013.01); *H01L 2223/6683* (2013.01); *H01L 2224/16225* (2013.01)

(58) Field of Classification Search
CPC ..... H01L 23/66; H01L 23/3675; H01L 23/40; H01L 23/4006

USPC .......................................................... 361/709
See application file for complete search history.

(56) References Cited

U.S. PATENT DOCUMENTS

| | | | | |
|---|---|---|---|---|
| 4,200,909 A | * | 4/1980 | Milum | H02M 7/06 361/235 |
| 4,542,358 A | * | 9/1985 | Boby | H01P 1/20363 333/12 |
| 4,968,962 A | * | 11/1990 | Hohider | H01H 61/02 174/138 G |

(Continued)

FOREIGN PATENT DOCUMENTS

JP    2009038696 A    2/2009

OTHER PUBLICATIONS http://www.antenna-theory.com/tutorial/waveguides/waveguide.php, 2009-2011.*

*Primary Examiner* — Dion R Ferguson
*Assistant Examiner* — Mandeep S Buttar
(74) *Attorney, Agent, or Firm* — Slater Matsil, LLP

(57) ABSTRACT

An electronic system includes a carrier including at least one waveguide feeding, a semiconductor chip including a first surface and a second surface, and an integrated RF circuit, and a cooling element including a backshort. The semiconductor chip is mounted to the carrier such that the first surface faces the carrier. The integrated RF circuit is connected to the at least one waveguide feeding. The cooling element is mounted to the carrier such that the backshort is adjacent one end of the at least one waveguide feeding, and the cooling element at least partially covers the semiconductor chip such that the second surface of the semiconductor chip faces the cooling element.

18 Claims, 3 Drawing Sheets

(56) References Cited

U.S. PATENT DOCUMENTS

| | | | |
|---|---|---|---|
| 5,202,648 A * | 4/1993 | McCandless | H01P 5/107 333/26 |
| 5,235,300 A * | 8/1993 | Chan | H01L 23/66 257/728 |
| 2007/0080458 A1 | 4/2007 | Ogawa et al. | |
| 2011/0057741 A1 | 3/2011 | Dayan et al. | |
| 2011/0063812 A1 * | 3/2011 | Nakanishi | H01L 23/49827 361/783 |

* cited by examiner

ELECTRONIC SYSTEM

This application claims the priority of German patent application 10 2014 105 594.2, filed on Apr. 17, 2014, which is hereby incorporated herein by reference.

TECHNICAL FIELD

This disclosure in general relates to an electronic system, in particular an electronic system including an integrated circuit.

BACKGROUND

An electronic system with an integrated circuit may include a carrier such as, for example, a PCB (Printed Circuit Board), the integrated circuit mounted to the PCB, and a waveguide on the PCB and connected to the integrated circuit. One challenge in the design of these electronic systems is cooling the integrated circuit, that is, dissipating heat from the integrated circuit.

SUMMARY

One embodiment relates to an electronic system. The system includes a carrier with at least one first waveguide, a semiconductor chip with a first surface, and a second surface, and a cooling element with a backshort. The semiconductor chip is mounted to the carrier such that the first surface faces the carrier. An integrated circuit included in the semiconductor chip is connected to the at least one waveguide. The cooling element is mounted to the carrier such that the backshort is adjacent one end of the at least one first waveguide, and the cooling element at least partially covers the semiconductor chip such that the second surface of the semiconductor chip faces the cooling element.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION OF ILLUSTRATIVE EMBODIMENTS

In the following detailed description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

Figure 1:
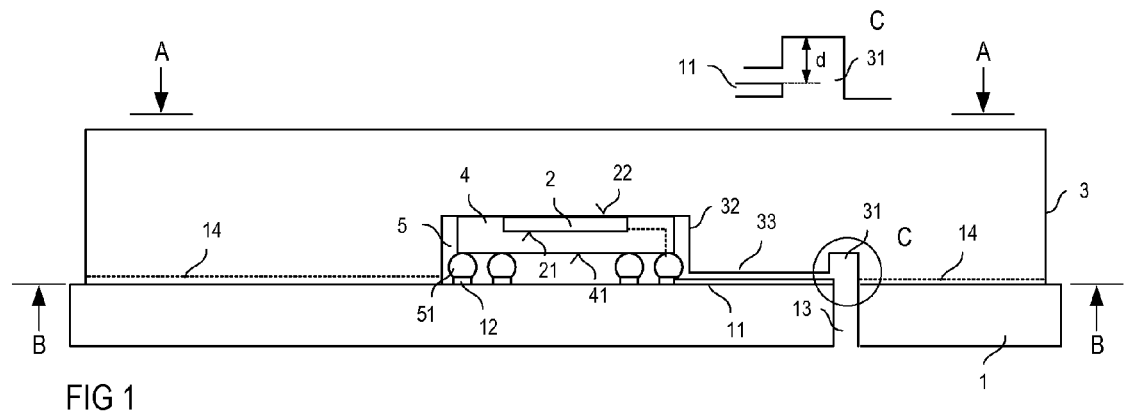
FIG. 1 shows a vertical cross sectional view of one embodiment of an electronic system which includes a carrier, a semiconductor chip, and a cooling element.

FIG. 1 shows a vertical cross sectional view of an electronic system according to one embodiment. The electronic system includes a carrier 1 with at least one waveguide feeding 11, and a semiconductor chip 2 having an integrated circuit integrated therein. The integrated circuit is, for example, a circuit capable of processing radio frequency (RF) signals. In this context, an RF signal means a signal selected from a frequency range of between several gigahertz (GHz) and several terahertz (THz). The semiconductor chip includes a first surface 21, and a second surface 22. The electronic system further includes a cooling element 3 which includes a backshort 31. The backshort 31 provides a short circuit for a guided wave. Referring to FIG. 1, the semiconductor chip 2 is mounted to the carrier 1 such that the first surface 21 of the semiconductor chip 2 faces the carrier 1. The integrated circuit in the semiconductor chip 2 is connected to the at least one waveguide feeding 11. Further, the cooling element 3 is mounted to the carrier 1 such that the backshort 31 is adjacent one end of the at least one waveguide feeding. The cooling element 3 at least partially covers the semiconductor chip 2 such that the second surface 22 of the semiconductor chip 2 faces the cooling element 3. Although the drawings only show one semiconductor chip 2, the system could also include two or more semiconductor chips as well.

In the embodiment shown in FIG. 1, the electronic system further includes a chip package 4 which accommodates the semiconductor chip 2. The chip package 4 includes a wiring arrangement (not shown in FIG. 1) which includes contact pads (not shown in FIG. 1) that are accessible at a surface 41 of the chip package 4 which faces the carrier 1. The contact pads are connected to the integrated circuit in the semiconductor chip 2 via connection lines in the chip package 4. Connecting an electronic circuit in a semiconductor chip to contact pads of a chip package is a common technology so that no further explanations are required in this regard.

The carrier 1 is a planar carrier from which only one section is illustrated in FIG. 1. According to one embodiment, the carrier 1 is a printed circuit board (PCB). However, other types of carriers suitable for accommodating electronic components may be used as well.

Referring to FIG. 1, the electronic system may further include a ball grid array 5 with a plurality of electrically conducting balls 51, with each of these balls 51 connected between a contact pad of the chip package 4 and a corresponding contact pad 12 of the carrier 1. The waveguide feeding 11 may be connected to the semiconductor chip 2 via at least one of these electrically conducting balls 51. That is, the waveguide 7 may be connected to at least one ball 51, the at least one ball 51 may be connected to at least one contact pad of the chip package 4, and the at least one contact pad is electrically connected to the circuit integrated in the semiconductor chip 2 via the wiring arrangement of the chip package 4. One connection line of this wiring arrangement is schematically illustrated in dotted lines in FIG. 1.

In the embodiment shown in FIG. 1, a part of the chip package 4 is arranged between the semiconductor chip 2 and the carrier 1, while the chip package 4 may be open on the opposite side so that the semiconductor chip 2 is exposed on a side of the chip package 4 facing away from the carrier 1. The cooling element 3 may directly contact the chip 2. According to another embodiment, an electrically insulating, but thermally conducting, layer (not shown) is arranged between the semiconductor chip 2 and the cooling element 3.

According to one embodiment, the integrated circuit is integrated in the semiconductor chip 2 in the region of the first surface 21, which can also be referred to as front side of the semiconductor chip 2. This integrated circuit may include several inputs, outputs and supply terminals, respectively, which are connected to contact pads 12 on the carrier 1 through the wiring arrangement in the chip package 4 and the ball grid array 5. The contact pads 12 are connected to connection lines (not illustrated) on the carrier 1 which allow the integrated circuit to be connected to other circuits, to a power supply, or the like. In the region of the second surface 22 no electronic devices are integrated so that the second surface may directly contact the cooling element 3.

A radio frequency (RF) input or output of the semiconductor chip 2 is connected to the waveguide feeding 11 in the way explained before, that is, via the wiring arrangement in the chip package 4 and the ball grid array. Through the waveguide feeding 11, the semiconductor chip 2 may either transmit an RF signal, or receive an RF signal. In this context, an RF signal means a signal selected from a frequency range of between several gigahertz (GHz) and several terahertz (THz). The RF signal is, for example, a microwave signal or a millimeter wave signal such as, for example, a radar signal with a frequency of several 10 GHz, such as, for example, a 77 GHz radar signal.

The RF signal sent or received by the RF circuit can be guided through a through hole 13 of the carrier 1. The through hole 13 is located close to that end of the waveguide feeding 11 which faces away from the semiconductor chip 2 and the ball grid array 5, respectively.

Referring to FIG. 1, the cooling element 3 serves two functions. First, the cooling element 3 provides a backshort for the RF signal transmitted or received by the waveguide feeding 11 through the through hole 13. In this embodiment, the backshort 31 is a cavity of the cooling element 3 adjacent the end of the waveguide feeding 11 and above the through hole 13. A depth of this cavity is adapted to the wavelength of the RF signal. According to one embodiment, a depth d of the cavity 31 is about $\lambda/4$ (lambda/4), where $\lambda$ denotes the wavelength of the RF signal. If, for example, the waveguide feeding 11 transmits an RF signal, then a part of this RF signal is directly transmitted through the through hole 13, while another part is reflected in the cavity 31. If, the depth d of the cavity 31 is $\lambda/4$, then the reflected part is added to the part transmitted through the through hole 13, so as to keep transmission losses low. The depth d of this cavity 31 is either measured from a top surface of the waveguide feeding 11 as illustrated in the enlarged detail C in FIG. 1, or from the surface of the cooling element 3 mounted to the carrier 1.

Second, the cooling element 3 serves to cool the semiconductor chip 2 by dissipating heat from the semiconductor chip 2. The cooling element 3 which at least partially covers the semiconductor chip 2 may dissipate the heat to the carrier 1 to which it is mounted and/or to the ambient atmosphere. According to one embodiment, the carrier 1 is plated with a thermally conducting material 14 in those regions where the cooling element 3 contacts the carrier 1. Examples of this layer 14 include one or more thermally conducting layers such as, for example one or more metallic layers. Examples of these layers include a nickel plating, a gold plating, or the like. The layer 14 may even include several layers such as, for example, a nickel plating on the carrier 1 and a gold plating on the nickel plating. Alternatively, the layer 14 may include a carbon based material such as, for example, graphene or carbon nanotubes. Layer 14 helps to provide for a low thermal resistance between the cooling element 3 and the carrier 1. The carrier 1 may be mounted to a further cooling element (not shown) which serves to dissipate heat from the carrier 1.

The cooling element 3 may include or consist essentially of a thermally conducting material. A thermally conducting material may include a metallic material. A metallic material is, for example, a metal such as, for example, aluminum or copper, a metallic compound such as, or a metal alloy. The cooling element 3 includes not necessarily an electrically conducting material. However, in case the cooling element includes a not electrically conducting (electrically insulating material), it may include an electrically conducting plating in the cavity 31 which forms the backshort.

Referring to FIG. 1, the cooling element 3 includes a further cavity 32 which serves to accommodate the semiconductor chip 2, in particular the chip package 4 with the semiconductor chip 2, and the ball grid array 5. A depth of this cavity 32 is adapted to a height of the ball grid array 5, and the chip package 4 such that the cooling element 3 can thermally contact the semiconductor chip 2.

Referring to FIG. 1, the cooling element 3 may include a further cavity 33 above the waveguide feeding 11. This further cavity 33 prevents the cooling element 3 from electrically contacting the waveguide feeding 11.

Figure 2:
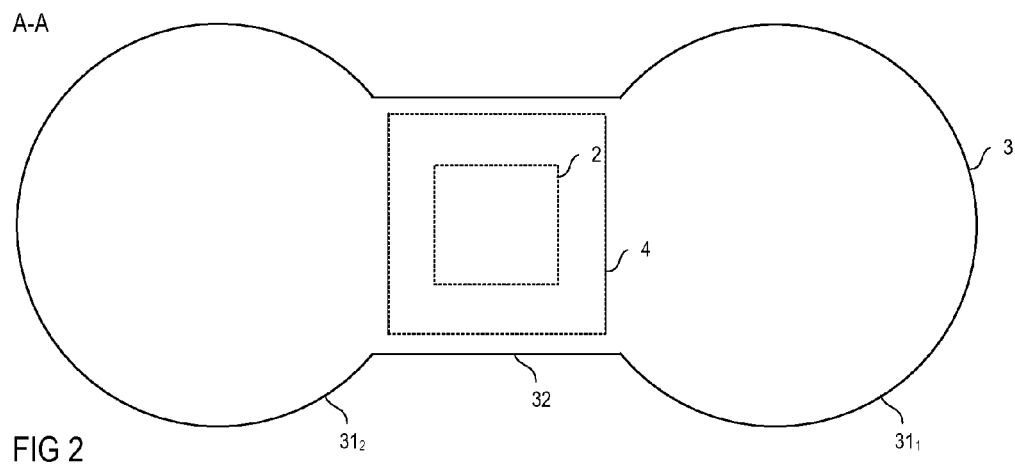
FIG. 2 shows a top view of the cooling element according to one embodiment.

FIG. 2 shows a top view of the cooling element 3 according to one embodiment. The position of the chip package 4 and the semiconductor chip 2 below the cooling element 3 is illustrated in dotted lines in FIG. 2. The cooling element 3 shown in FIG. 2 includes two substantially circular sections $31_1$, $31_2$ and a bridge section 32 between the two circular sections $31_1$, $31_2$. In this embodiment, the chip package 4 is located substantially below the bridge section 32. Further, the cooling element 3, in particular the bridge section 32, completely covers the chip package 4 with the semiconductor chip 2. However, this is only an example. According to another embodiment (not shown), the cooling element 3 only partially covers (overlaps) the chip package 4 with the semiconductor chip 2.

Figure 3:
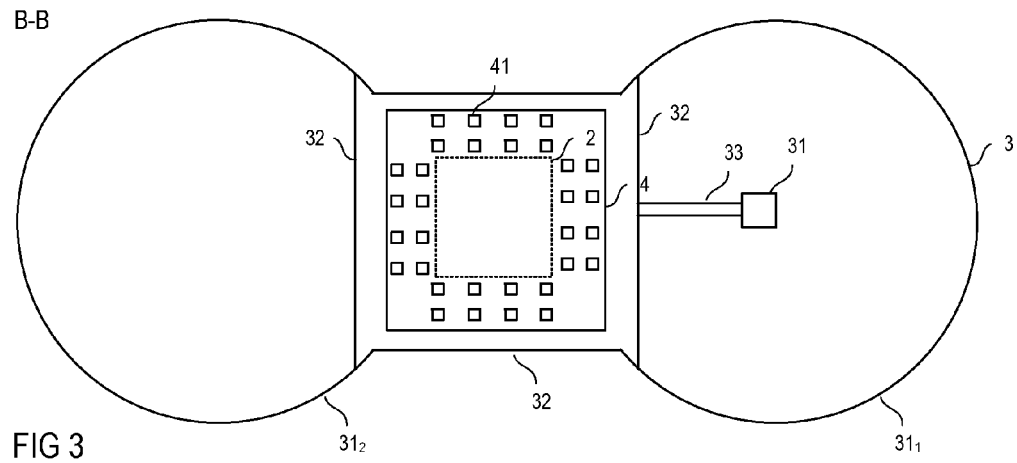
FIG. 3 shows a bottom view of the cooling element according to one embodiment.

FIG. 3 shows a bottom view of the cooling element 3 with the first cavity 31 which forms the backshort, the second cavity 32 which accommodates the chip package 4, and the third cavity 33 which accommodates the waveguide feeding 11. Further, in FIG. 3, a bottom view of the chip package 4 is shown. The position of the semiconductor chip 2 inside the chip package 4 is illustrated in dotted lines in FIG. 3.

Referring to FIG. 3, the chip package 4 includes a plurality of contact pads 41 at the surface 41 which faces the carrier when the cooling element 3 is mounted to the carrier (see FIG. 1). These contact pads 41 can be electrically connected to balls of the ball grid array (see reference character 5 in FIG. 1).

In the embodiment shown in FIG. 3, the second cavity 32 which serves to accommodate the chip package 4 extends along a complete width of the bridge section 32. The "width" of the bridge section 32 is the dimension of the bridge section 32 in a direction perpendicular to the direction in which the circular sections 31₁, 31₂ are distant. However, having the second cavity 32 to extend along the complete width of the bridge section 32 is only an example. According to another embodiment (not shown), the cavity 32 is distant to edges of the bridge section 32.

The cooling element 3 may include only one piece of material such as, for example, one of the materials explained above. The cavities 31, 32, 33 may be formed using conventional working techniques such as, for example, milling, grinding, drilling, or the like.

It should be noted that implementing the cooling element 3 with two circular sections 31₁, 31₂ and a bridge section 32 is only an example. The cooling element 3 may be implemented with any other geometry which is suitable to dissipate heat from the semiconductor chip 2 and to act as a backshort as well.

Figure 4:
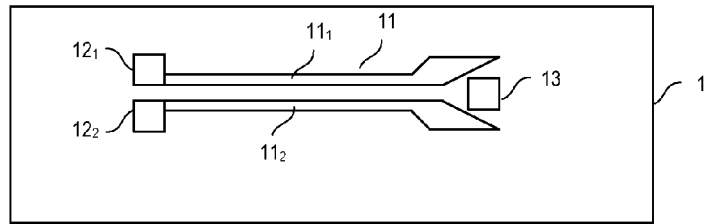
FIG. 4 shows one embodiment of a waveguide feeding on the carrier.

FIG. 4 shows a top view of the carrier 1 in the section where the waveguide feeding 11 is located. In this embodiment, the waveguide feeding 11 includes two substantially parallel lines (strips) 11₁, 11₂, with each of these strips being connected to one contact pad 12₁, 12₂. These contact pads 12₁, 12₂ are connected to the integrated circuit via the ball grid array (5 in FIG. 1), and a wiring arrangement in the chip package (4 in FIG. 1). However, the ball grid array and the chip package are not illustrated in FIG. 4. FIG. 4 also shows the through hole 13 which is located adjacent the end of the waveguide feeding 11. In the embodiment shown in FIG. 4, the through hole 13 has a substantially rectangular cross section. However, this is only an example. Other types of cross sections such as, for example, a circular cross section, may be used as well. The mutual distance between the two strip lines 11₁, 11₂ increases towards the end of the waveguide feeding 11, which enables the RF signal to be transmitted from the waveguide feeding 11 through the through hole 13.

Figure 5:
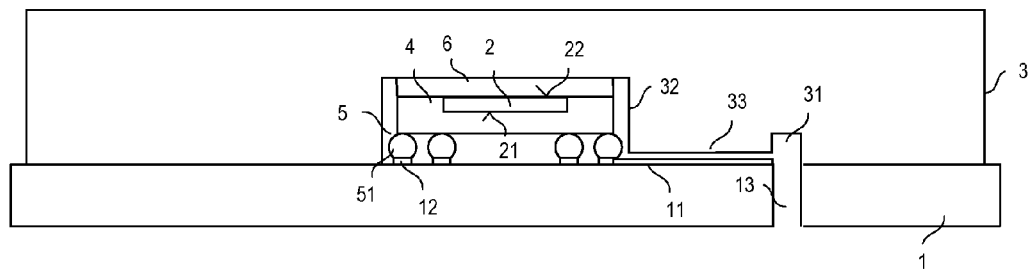
FIG. 5 shows a vertical cross sectional view of one embodiment of an electronic system which includes a compressible layer between the semiconductor body and the cooling element.

FIG. 5 shows a vertical cross sectional view of an electronic system according to a further embodiment. In this embodiment, the electronic system includes a thermally conducting and compressible layer 6 between the semiconductor chip 2 and the cooling element 3. This flexible layer 6 protects the semiconductor chip 2 from being mechanically damaged when the cooling element 3 is mounted to the carrier 1. The layer 6 may include a ceramic based thermally conducting material, a silicone based material, a so-called thermal pad, a thermal paste, or the like. The flexible layer 6 may directly contact the semiconductor chip 2 on the second surface 22 (as shown in FIG. 5). According to another embodiment (not shown), there is an electrically insulating layer between the second surface 22 of the semiconductor chip 2 and the flexible layer 6.

Figure 6:
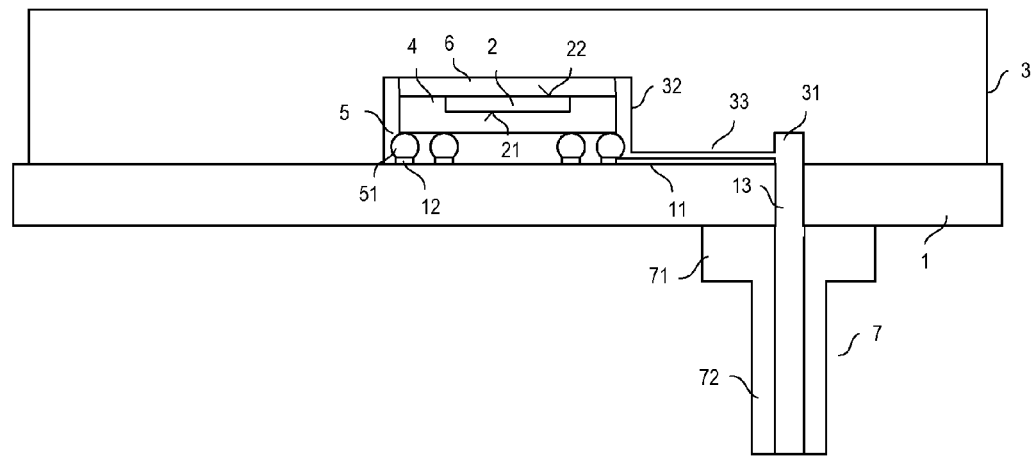
FIG. 6 shows a shows a vertical cross sectional view of one embodiment of an electronic system which additionally includes a tubular (hollow) waveguide.

FIG. 6 shows a vertical cross sectional view of an electronic system according to yet another embodiment. In this embodiment, the electronic system further includes a tubular (hollow) waveguide 7. This waveguide 7 includes a flange 71 mounted to the carrier 1 and a tubular section 72. The waveguide 7 is mounted to the carrier 1 on a side opposite the cooling element 3 such that the through hole 13 in the carrier 1 opens out into the tubular section 72 of the second waveguide 7, so that an RF signal travelling through the through hole 13 can further travel in the waveguide 7. The waveguide may include a conventional waveguide cross section such as, for example, a rectangular or circular cross section.

Figure 7:
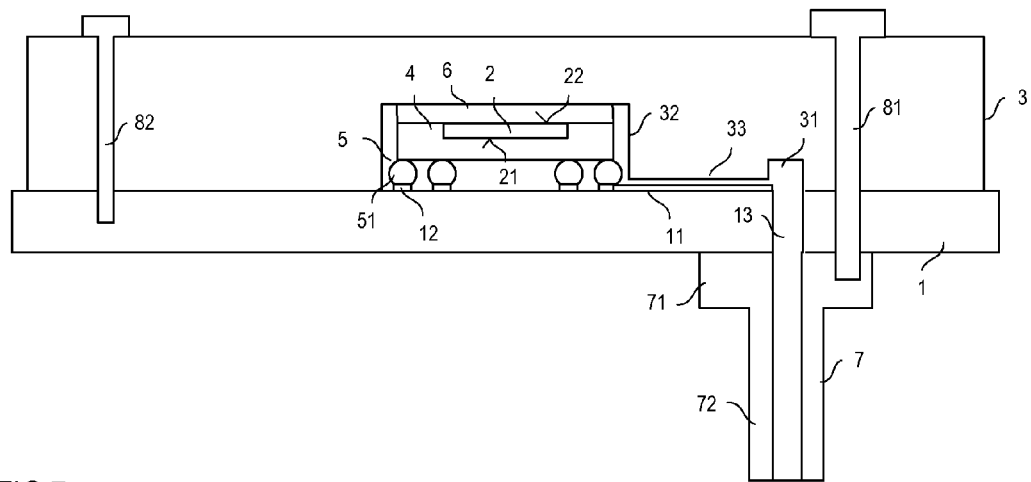
FIG. 7 illustrates one way of mounting the cooling element and the waveguide to the carrier.

The waveguide may be mounted to the carrier 1 using conventional fastening techniques such as, for example, screwing, gluing or soldering. FIG. 7 shows a vertical cross sectional view of an electronic system in which the waveguide is mounted to the carrier 1 by screwing. The electronic system shown in FIG. 7 is based on the system shown in FIG. 6 and, therefore, includes the flexible layer 6 between the chip 2 and the cooling element 3. However, this layer 6 may be omitted.

Referring to FIG. 7, the waveguide 7 is mounted to the carrier 1 by screwing. In this embodiment, a screw 81 goes through the cooling element 3 and the carrier 1 into the flange 71 of the waveguide 7. The flange 71 of the waveguide 7 includes a screw hole with an inside thread so that the screw 81 can be screwed into the flange 71. The cross section shown in FIG. 7 only shows one screw 81 for mounting the waveguide 7 to the carrier 1. However, the electronic system may include additional screws for mounting the waveguide to the carrier 1 which are out of view in the cross section shown in FIG. 7.

Like the waveguide 7, the cooling element may be mounted to the carrier 1 using conventional fastening (mounting) techniques such as, for example, screwing, gluing, or soldering. FIG. 7 shows an embodiment in which the cooling element is mounted to the carrier 1 by screwing. In FIG. 7, only one screw 82 for screwing the cooling element 3 to the carrier 1 is shown. This screw 82 extends through the cooling element 3 into the carrier 1. The carrier 1 may include a screw hole with an inside thread into which the screw 82 can be screwed. The electronic system may include further screws corresponding to the screw 82 for mounting the cooling element 3 to the carrier 1. However, these further screws are not shown (out of view) in FIG. 7.

Figure 8:
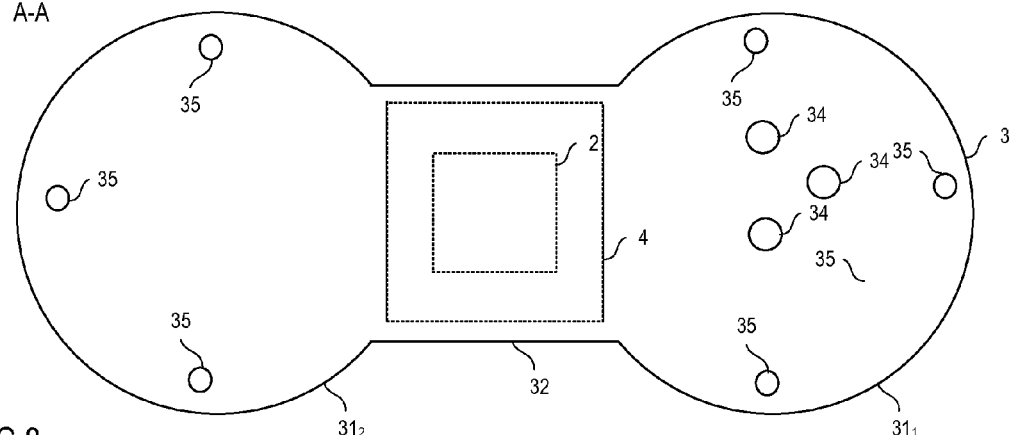
FIG. 8 shows a top view of one embodiment of the cooling element which includes screw holes.

FIG. 8 shows a top view of one embodiment of a cooling element 3 in an electronic system as shown in FIG. 7. In FIG. 8, reference character 34 denotes first screw holes in the cooling element 3 that may serve for screwing the waveguide 7 to the carrier 1. That is, these first screw holes 34 accommodate screws corresponding to the screw 81 shown in FIG. 7. Reference character 35 denotes second screw holes that may be used for screwing the cooling element 3 to the carrier. That is, these second screw holes 35 accommodate screws corresponding to the screw 82 shown in FIG. 7. As can be seen from FIG. 8, there may be several first screw holes 34 for screwing the waveguide to the carrier 1, and several second screw holes 35 for screwing the cooling element 3 to the carrier.

Figure 9:
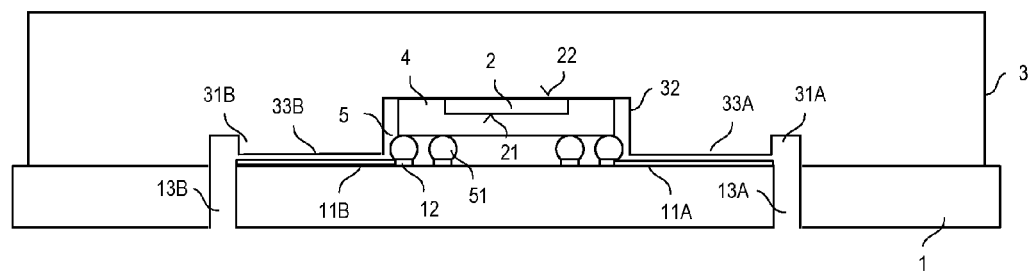
FIG. 9 shows a vertical cross sectional view of an electronic system according to another embodiment.

FIG. 9 shows a vertical cross sectional view of an electronic system according to another embodiment. In this embodiment, the electronic system includes two waveguide feedings 11A, 11B and two through holes 13A, 13B at the end of these waveguide feedings 11A, 11B. According to one embodiment, one of these waveguide feedings 11A, 11B serves to receive an RF signal which is forwarded to the RF circuit in the chip, while the other one may serve to transmit an RF signal received from the RF circuit in the chip 2. Everything that has been explained with reference to the waveguide feeding 11 hereinbefore applies to each of the waveguide feedings 11A, 11B accordingly. In particular, the cooling element 3 includes a cavity 31A, 31B acting as a backshort at the end of each of the two waveguide feedings 11A, 11B. Further, the cooling element 3 includes a second cavity 33A, 33B adjacent each of the two waveguide feedings 11A, 11B. A compressible buffer layer (see reference character 6 in FIGS. 5-7) in is not shown in the electronic system of FIG. 9. However, such buffer layer may be used as explained with reference to the embodiments explained hereinbefore. Further, a waveguide may be mounted to the carrier 1 below each of the two through holes 13A, 13B in the way explained with reference to FIG. 7. These waveguides (not shown in FIG. 9) and the cooling element 3 may be mounted to the carrier 1 in the way explained with reference to FIG. 7.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second" and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. An electronic system, comprising: a carrier comprising a waveguide feeding; a semiconductor chip comprising a first surface, a second surface, and an integrated circuit, wherein the semiconductor chip is mounted to the carrier such that the first surface faces the carrier and such that the integrated circuit is connected to the waveguide feeding; and a cooling element configured to dissipate heat from the semiconductor chip, the cooling element comprising a first cavity that forms a backshort and a second cavity that accommodates the semiconductor chip, wherein the cooling element is mounted to the carrier such that the backshort is adjacent to one end of the waveguide feeding, a surface of the cooling element contacts the carrier, and the cooling element at least partially covers the semiconductor chip such that the second surface of the semiconductor chip faces the cooling element; and further comprising an additional waveguide feeding, wherein the additional waveguide feeding is located on a side of the semiconductor chip opposite the waveguide feeding and the integrated circuit is connected to the additional waveguide feeding; and a third cavity that forms an additional backshort, wherein the cooling element is mounted to the carrier such that the additional backshort is adjacent to the additional waveguide feeding.

2. The electronic system of claim 1, further comprising a chip package, wherein the semiconductor chip is arranged in the chip package.

3. The electronic system of claim 1, further comprising a thermally conducting buffer layer arranged between the second surface of the semiconductor chip and the cooling element.

4. The electronic system of claim 3, wherein the buffer layer comprises a compressible material.

5. The electronic system of claim 3, wherein the buffer layer comprises a ceramic based material or a silicone based material.

6. The electronic system of claim 1, wherein the cooling element comprises a metallic material.

7. The electronic system of claim 6, wherein the metallic material comprises aluminum or copper.

8. The electronic system of claim 1, wherein a majority of the cooling element comprises an electrically insulating material and wherein the first cavity is plated with an electrically conducting material.

9. The electronic system of claim 1, wherein the cooling element is mounted to the carrier by gluing or soldering.

10. The electronic system of claim 1, wherein the carrier is a printed circuit board.

11. The electronic system of claim 1, further comprising a ball grid array electrically connecting the integrated circuit to contact pads on the carrier.

12. The electronic system of claim 1, wherein the carrier comprises a through hole adjacent one end of the waveguide feeding and wherein the electronic system further comprises a waveguide mounted to the carrier on a side opposite the waveguide feeding.

13. The electronic system of claim 12, wherein the waveguide comprises a hollow tube.

14. The electronic system of claim 13, wherein the waveguide comprises a flange and wherein the waveguide is mounted to the carrier by screws extending from the cooling element through the carrier into the flange.

15. The electronic system of claim 1, wherein the waveguide feeding comprises two substantially parallel strips.

16. The electronic system of claim 1, wherein the integrated circuit is capable of processing microwave signals or millimeter wave signals.

17. An electronic system, comprising:
a carrier comprising a waveguide feeding and a through hole adjacent to one end of the waveguide feeding;
a waveguide mounted to the carrier on a side opposite the waveguide feeding;
a semiconductor chip comprising a first surface, a second surface, and an integrated circuit, wherein the semiconductor chip is mounted to the carrier such that the first surface faces the carrier and the integrated circuit is connected to the waveguide feeding;
a cooling element configured to dissipate heat from the semiconductor chip, the cooling element comprising a first cavity that forms a backshort and a second cavity that accommodates the semiconductor chip, wherein
the cooling element is mounted to the carrier such that the backshort is adjacent to one end of the waveguide feeding,
a surface of the cooling element contacts the carrier, and
the cooling element at least partially covers the semiconductor chip such that the second surface of the semiconductor chip faces the cooling element;
a first screw passing through the cooling element and the carrier, wherein the first screw connects the cooling element to the carrier and the first screw further connects the waveguide to the carrier; and a second screw passing through the cooling element, wherein
the second screw does not pass through the carrier,
the second screw connects the cooling element to the carrier,
the second screw is located on a side of the semiconductor chip opposite the first screw, and
a lateral distance from the waveguide to the first screw is smaller than a lateral distance from the waveguide to the second screw.

18. An electronic system, comprising:

a carrier comprising a waveguide feeding and a through hole adjacent to one end of the waveguide feeding;

a waveguide mounted to the carrier on a side opposite the waveguide feeding;

a semiconductor chip comprising a first surface and a second surface, and an integrated circuit, wherein the semiconductor chip is mounted to the carrier such that the first surface faces the carrier and the integrated circuit is connected to the waveguide feeding;

a cooling element configured to dissipate heat from the semiconductor chip, the cooling element comprising a first cavity that forms a backshort and a second cavity that accommodates the semiconductor chip, wherein
the cooling element is mounted to the carrier such that the backshort is adjacent to one end of the waveguide feeding,
a surface of the cooling element contacts the carrier,
the cooling element at least partially covers the semiconductor chip such that the second surface of the semiconductor chip faces the cooling element,
the cooling element, when viewed from a top view, comprises two substantially circular sections and a bridge section,
the bridge section is rectangular, the two substantially circular sections are connected by the bridge section, and
the semiconductor chip is disposed directly beneath the bridge section;

a first screw passing through the cooling element and the carrier, wherein the first screw connects the cooling element to the carrier, and wherein the first screw further connects the waveguide to the carrier; and a second screw passing through the cooling element, wherein the second screw does not pass through the carrier, wherein
the second screw connects the cooling element to the carrier,
the second screw is located on a side of the semiconductor chip opposite the first screw; and
a lateral distance from the waveguide to the first screw is smaller than a lateral distance from the waveguide to the second screw.

* * * * *